US012796447B2

(12) United States Patent
Joshi et al.

(10) Patent No.: US 12,796,447 B2
(45) Date of Patent: Nov. 10, 2026

(54) VERTICAL POWER SEMICONDUCTOR DEVICE COMPRISING SOURCE OR EMITTER PAD

(71) Applicant: Infineon Technologies AG, Neubiberg (DE)

(72) Inventors: Ravi Keshav Joshi, Klagenfurt am Wörthersee (AT); Carsten Schaeffer, Annenheim (AT)

(73) Assignee: Infineon Technologies AG, Neubiberg (DE)

(*) Notice: Subject to any disclaimer, the term of this patent is extended or adjusted under 35 U.S.C. 154(b) by 403 days.

(21) Appl. No.: 18/606,152

(22) Filed: Mar. 15, 2024

(65) Prior Publication Data

US 2024/0347456 A1 Oct. 17, 2024

(30) Foreign Application Priority Data

Apr. 14, 2023 (DE) ......................... 102023109506.4

(51) Int. Cl.
*H10D 30/63* (2025.01)
*H10D 30/01* (2025.01)
(Continued)

(52) U.S. Cl.
CPC .......... *H10W 20/435* (2026.01); *H10D 30/01* (2025.01); *H10D 30/63* (2025.01);
(Continued)

(58) Field of Classification Search
CPC . H10W 20/425; H10W 20/435; H10W 20/48; H10W 70/20; H10D 30/01;
(Continued)

(56) References Cited

U.S. PATENT DOCUMENTS

2015/0333060 A1* 11/2015 Decker .................. H10D 30/63 257/392
2015/0372095 A1 12/2015 Saito et al.
(Continued)

FOREIGN PATENT DOCUMENTS

CN 113838837 A 12/2021
WO 2019198167 A1 10/2019

*Primary Examiner* — Hoai V Pham
(74) *Attorney, Agent, or Firm* — Cooper Legal Group LLC

(57) ABSTRACT

A vertical power semiconductor device is proposed. The vertical power semiconductor device includes a silicon carbide (SiC) semiconductor body having a first surface and a second surface opposite to the first surface. A first wiring level is arranged over the first surface. The first wiring level includes a first lower source or emitter pad and a second lower source or emitter pad. A second wiring level is arranged over the first wiring level. The second wiring level includes a gate pad and a source or emitter pad. The source or emitter pad of the second wiring level is electrically connected to the first lower source or emitter pad and to the second lower source or emitter pad of the first wiring level. The first wiring level further includes a gate line laterally arranged between the first lower source or emitter pad and the second lower source or emitter pad. The gate line is vertically arranged between the source or emitter pad of the second wiring level and the first surface. The gate line is electrically insulated from the source or emitter pad of the second wiring level by an intermediate dielectric structure.

19 Claims, 3 Drawing Sheets

(51) Int. Cl.
*H10D 62/83* (2025.01)
*H10D 62/832* (2025.01)
*H10W 20/41* (2026.01)
*H10W 20/48* (2026.01)

(52) U.S. Cl.
CPC ..... *H10D 62/8303* (2025.01); *H10D 62/8325* (2025.01); *H10W 20/425* (2026.01); *H10W 20/48* (2026.01)

(58) Field of Classification Search
CPC ............... H10D 30/63; H10D 62/8303; H10D 62/8325; H10D 64/252
See application file for complete search history.

(56) References Cited

U.S. PATENT DOCUMENTS

| | | | | |
|---|---|---|---|---|
| 2021/0098346 | A1 | 4/2021 | Okuyama et al. | |
| 2021/0288154 | A1* | 9/2021 | Tanaka | H10D 30/645 |
| 2022/0093761 | A1 | 3/2022 | Siemieniec et al. | |

* cited by examiner

VERTICAL POWER SEMICONDUCTOR DEVICE COMPRISING SOURCE OR EMITTER PAD

RELATED APPLICATION

This application claims priority to German Patent Application No. 102023109506.4, filed on Apr. 14, 2023, entitled "VERTICAL POWER SEMICONDUCTOR DEVICE COMPRISING SOURCE OR EMITTER PAD", which is incorporated by reference herein in its entirety.

TECHNICAL FIELD

The present disclosure is related to a vertical power semiconductor device, in particular to a vertical power semiconductor device comprising a wiring level including a source or emitter pad.

BACKGROUND

Technology development of new generations of vertical power semiconductor devices, such as, for example, metal oxide semiconductor field effect transistors (MOSFETs), or insulated gate bipolar transistors (IGBTs), or junction field effect transistors (JFETs), aims at improving electric device characteristics and reducing costs by shrinking device geometries. Although costs may be reduced by shrinking device geometries, a variety of tradeoffs and challenges have to be met. For example, complying with reliability requirements requires design optimization, such as, for example, with respect to interconnects, when increasing device functionalities per unit area.

Thus, there is a need for an improved vertical power semiconductor device.

SUMMARY

An example of the present disclosure relates to a vertical power semiconductor device. The vertical power semiconductor device includes a silicon carbide (SiC) semiconductor body having a first surface and a second surface opposite to the first surface. The vertical power semiconductor device further includes a first wiring level over the first surface. The first wiring level includes a first lower source or emitter pad and a second lower source or emitter pad.

The vertical power semiconductor device further includes a second wiring level over the first wiring level. The second wiring level includes a gate pad and a source or emitter pad. The source or emitter pad of the second wiring level is electrically connected to the first lower source or emitter pad and to the second lower source or emitter pad of the first wiring level. The first wiring level further includes a gate line laterally arranged between the first lower source or emitter pad and the second lower source or emitter pad. The gate line is vertically arranged between the source or emitter pad of the second wiring level and the first surface. The gate line is electrically insulated from the source or emitter pad of the second wiring level by an intermediate dielectric structure.

Another example of the present disclosure relates a vertical power semiconductor device. The vertical power semiconductor device includes a SiC semiconductor body having a first surface and a second surface opposite to the first surface. The vertical power semiconductor device further includes a first trench structure extending into the SiC semiconductor body from the first surface. The vertical power semiconductor device further includes a plurality of second trench structures branching off from the first trench structure. A cross-sectional area of the first trench structure is larger than a cross sectional area of each of the plurality of second trench structures. The vertical power semiconductor device further includes a wiring level over the first surface. The wiring level includes a gate pad and a source or emitter pad.

Another example of the present disclosure relates a method of manufacturing a vertical power semiconductor device. The method includes forming a first wiring level over a first surface of a SiC semiconductor body having the first surface and a second surface opposite to the first surface. The first wiring level includes a first lower source or emitter pad and a second lower source or emitter pad. The method further includes forming a second wiring level over the first wiring level. The second wiring level includes a gate pad and a source or emitter pad. The source or emitter pad of the second wiring level is electrically connected to the first lower source or emitter pad and to the second lower source or emitter pad of the first wiring level. The first wiring level further includes a gate line laterally arranged between the first lower source or emitter pad and the second lower source or emitter pad. The gate line is vertically arranged between the source or emitter pad of the second wiring level and the first surface. The gate line is electrically insulated from the source or emitter pad of the second wiring level by an intermediate dielectric structure.

Another example of the present disclosure relates a method of manufacturing a vertical power semiconductor device. The method includes forming a first trench structure extending into a SiC semiconductor body from a first surface, the SiC semiconductor body having the first surface and a second surface opposite to the first surface. The method further includes forming a plurality of second trench structures branching off from the first trench structure, wherein a cross-sectional area of the first trench structure is larger than a cross sectional area of each of the plurality of second trench structures. The method further includes forming a wiring level over the first surface, the wiring level comprising a gate pad and a source or emitter pad.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of vertical power semiconductor devices and together with the description serve to explain principles of the examples. Further examples are described in the following detailed description and the claims.

DETAILED DESCRIPTION

Figure 1:
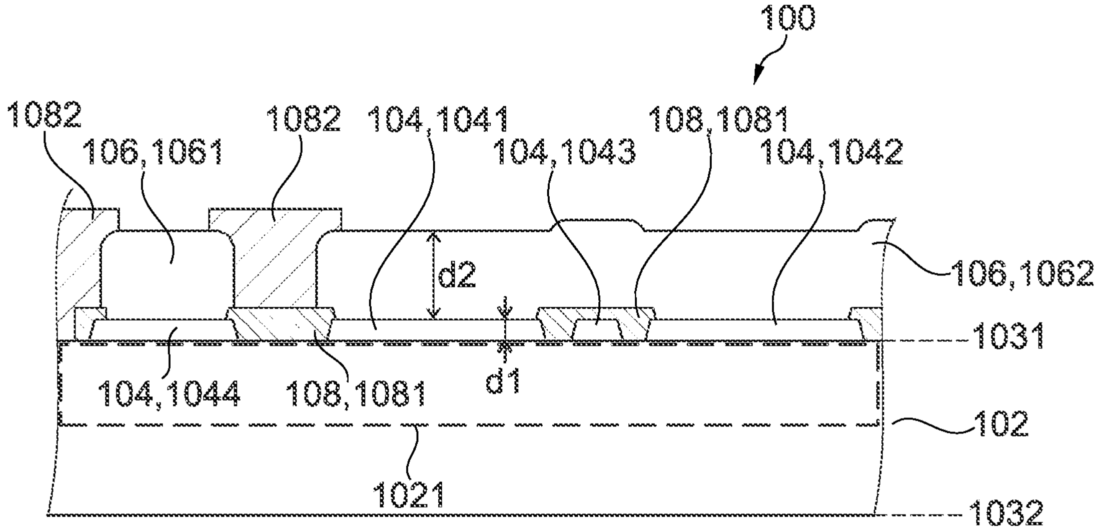
FIGS. 1 to 3 are schematic cross-sectional views for illustrating examples of vertical power semiconductor devices including a gate pad and a source or emitter pad.

In the following detailed description, reference is made to the accompanying drawings, which form a part hereof and in which are shown by way of illustrations specific examples of vertical power semiconductor devices. It is to be understood that other examples may be utilized and structural or logical changes may be made without departing from the scope of the present disclosure. For example, features illustrated or described for one example can be used in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" may describe a permanent low-resistive connection between electrically connected elements, for example a direct contact between the concerned elements or a low-resistive connection via a metal and/or heavily doped semiconductor material. The term "electrically coupled" may include that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact may be a non-rectifying electrical junction.

Ranges given for physical dimensions include the boundary values. For example, a range for a parameter y from a to b reads as $a \leq y \leq b$. The same holds for ranges with one boundary value like "at most" and "at least".

The terms "on" and "over" are not to be construed as meaning only "directly on" and "directly over". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

An example of the present disclosure relates to a vertical power semiconductor device. The vertical power semiconductor device includes a SiC semiconductor body having a first surface and a second surface opposite to the first surface. The vertical power semiconductor device includes a first wiring level over the first surface. The first wiring level may comprise a first lower source or emitter pad and a second lower source or emitter pad. The vertical power semiconductor device further includes a second wiring level over the first wiring level. The second wiring level may comprise a gate pad and a source or emitter pad. The source or emitter pad of the second wiring level may be electrically connected to the first lower source or emitter pad and to the second lower source or emitter pad of the first wiring level. The first wiring level may further comprise a gate line laterally arranged between the first lower source or emitter pad and the second lower source or emitter pad. The gate line may be vertically arranged between the source or emitter pad of the second wiring level and the first surface. The gate line may be electrically insulated from the source or emitter pad of the second wiring level by an intermediate dielectric structure.

The vertical power semiconductor device may be part of or may be at least one of: an integrated circuit, a discrete semiconductor device, or a semiconductor module, for example. The semiconductor device may be used in applications related to power transmission and distribution, automotive and transport, renewable energy, consumer electronics, and other industrial applications. The vertical power semiconductor device may be or a may include an insulated gate field effect transistor (IGFET) such as a metal oxide semiconductor field effect transistor (MOSFET), an insulated gate bipolar transistor (IGBT), a junction field effect transistor (JFET), or a thyristor, for example.

The vertical power semiconductor device may have a load current flow between the first surface and the second surface opposite to the first surface. The first surface may be a front surface or a top surface of the semiconductor body, and the second surface may be a back surface or a rear surface of the semiconductor body, for example. The semiconductor body may be attached to a lead frame via the second surface, for example. Over the first surface of the semiconductor body, interconnects may be arranged on a contact pad structure of a wiring area for electrically connecting device elements in the SiC semiconductor body to elements, such as, for example, other semiconductor devices, outside of the semiconductor device, for example.

The vertical power semiconductor device may be configured to conduct currents of more than 1 A, or more than 10 A, or more than 30 A, or more than 50 A, or more than 75 A, or even more than 100 A. The vertical power semiconductor device may be further configured to block voltages between load terminals, such as, for example, between collector and emitter of an IGBT, or between drain and source of a MOSFET or JFET, in the range of several hundreds of up to several thousands of volts, such as, for example, 400 V, 650V, 1.2 kV, 1.7 kV, 3.3 kV, 4.5 kV, 5.5 kV, 6 kV, 6.5 kV, 10 kV. The blocking voltage may correspond to a voltage class specified in a datasheet of the power semiconductor device, for example.

The semiconductor body may comprise or may be an epitaxially deposited semiconductor material. Separately or in combination, the semiconductor body may comprise a growth substrate. For example, vertical power semiconductor device may be based on a semiconductor body from a crystalline SiC material. For example, the semiconductor material may be 2H-SiC (SiC of the 2H polytype), 6H-SIC, 3C-SiC or 15R-SiC. According to an example, the semiconductor material is silicon carbide of the 4H polytype (4H-SiC). The semiconductor body may consist of a semiconductor substrate or may include or consist of a semiconductor substrate having none, one or more than one SiC layers, such as, for example, epitaxially grown SiC layers, thereon.

For realizing a desired current carrying capacity, the vertical power semiconductor device may be designed by a plurality of parallel-connected transistor cells in a transistor cell area. The parallel-connected transistor cells may, for example, be transistor cells formed in the shape of a strip or a strip segment. The transistor cells can also have any other shape, such as, for example, circular, elliptical, polygonal such as hexagonal or octahedral. The transistor cells may be arranged in the transistor cell area of the SiC semiconductor body. The transistor cell area may be an active area where a source region of a FET or JFET at the first surface and a drain region of the FET or JFET may be arranged opposite to one another along the vertical direction. Likewise, the transistor cell area may be an active area where an emitter region of an IGBT at the first surface and a collector region of the IGBT may be arranged opposite to one another along the vertical direction. In the transistor cell area, a load current may enter or exit the semiconductor body of the FET, or JFET, or IGBT, or thyristor, such as, for example, via contact plugs on the first surface of the semiconductor body. For example, the transistor cell area may be defined by an area where the lower source or emitter pads and the gate line(s) may be placed over the first surface of the SiC semiconductor body. An edge termination area may at least partly surround the transistor cell area and may include a termination structure. In a blocking mode or in a reverse biased mode of the FET, or JFET, or IGBT, the blocking voltage between the transistor cell area and a field-free region laterally drops across the termination structure in the edge termination area. The termination structure may have a higher or a slightly lower voltage blocking capability than the transistor cell area. The termination structure may include a junction termination extension (JTE) with or without a variation of lateral doping (VLD), one or more laterally separated guard rings, or any combination thereof, for example.

A wiring area over the first surface may include the first wiring level and the second wiring level. Each wiring level may be formed by a single one or a stack of conductive layers, such as, for example, metal layer(s), metal alloy layer(s), highly doped semiconductor layer(s), or any combination thereof. For example, the wiring levels may include at least one of Cu, Au, AlCu, Ag, or alloys thereof. The wiring levels may be lithographically patterned, for example. Between stacked wiring levels and/or between laterally spaced parts of each wiring level, the intermediate dielectric structure may be arranged. Contact plug(s) or contact line(s) may be formed in openings in the intermediate dielectric structure to electrically connect parts, such as, for example, metal lines or contact areas, of different wiring levels to one another. For example, an interlayer dielectric of the intermediate dielectric structure may be arranged between the first surface of the SiC semiconductor body and the first and second lower source or emitter pads. Contact plug(s) or contact line(s) may also be formed in openings in the interlayer dielectric structure to electrically connect parts of a lowermost wiring level (e.g. the wiring level located closest to the first surface such as the first wiring level) to the active area of the SiC semiconductor body, such as, for example, to a doped source or emitter region.

The first and second lower source or emitter pads may be parts of the patterned first wiring level. In other words, the first and second lower source or emitter pads may be laterally separated by a part of the intermediate dielectric structure. The gate line may be another part of the patterned first wiring level and may likewise be laterally separated from the lower source or emitter pads by a part of the intermediate dielectric structure, such as, for example, a first passivation structure, for example.

The vertical power semiconductor device provides a dual wiring level for the source or emitter pads. The first wiring level may allow for distributing gate current between gate electrodes in the active area and the gate pad via the gate line in the first wiring level as well as for distributing source or emitter current from the active area to the lower source or emitter pads. Since the source or emitter pad in the second wiring level may not interrupted by the gate line, a larger surface for interconnect technologies (e.g. sintering or soldering) may facilitate easier sintering on the source or emitter pad. This may also allow for increasing maximum current densities compared with a wire-based interconnection scheme, for example. Moreover, the lower source or emitter pad may be extended below the gate pad in view of the dual wiring level and allows for increasing the active area below the gate pad.

For example, the first wiring level may comprise copper and the second wiring level may comprise copper. In some examples, the first wiring level may predominantly be made of copper. Likewise, the second wiring level may predominantly, i.e. by more than 50% vol, be made of copper. For example, the copper of the first wiring level may be formed by an electrochemical copper deposition process, ECD process. A copper seed layer may be formed prior to the ECD process, for example. For example, the copper seed layer may be formed as a sputtered or evaporated Cu seed layer. In addition or as an alternative, the copper of the first wiring level may also be formed by a sputter deposition process. For example, the copper of the second wiring level may also be formed by an electrochemical copper deposition process, ECD process. A copper seed layer may be formed prior to the ECD process, for example. In addition or as an alternative, the copper of the second wiring level may also be formed by a sputter deposition process.

For example, the vertical power semiconductor device may further include a barrier layer arranged between the first wiring level and the second wiring level. The barrier layer may be a single layer or may be formed as a stack of sub-layers, for example. For example, the barrier layer may be configured to act as a hard layer to protect the lower source or emitter pads from damage when bonding on top of the source or emitter pad of the second wiring level. For example, the barrier layer may be formed by a physical vapor deposition process, PVD process, such as, for example, a sputter deposition process.

For example, the barrier layer may include a titanium-tungsten (Ti—W) alloy or a copper-titanium (Cu—Ti) alloy. For example, the Ti—W alloy layer may have a thickness ranging from several ten nanometers to several hundred nanometers. The Ti—W alloy layer may be configured to act as a hard layer for protecting the wiring layers in the first wiring level, such as, for example, the first and second source or emitter pads, from damage when bonding on top of the source or emitter pad of the second wiring level. The Cu—Ti alloy may be formed by Ti and Cu deposition. Caused by an annealing process, the deposited Ti may then react with Cu for forming hard Cu—Ti phases. The annealing process may be carried out after patterning the Cu by, for example, an etch process. The mechanical properties of the Cu—Ti alloy, such as, for example, hardness, may be beneficial with respect to wire bonding on top of the second wiring level, or with respect to including fine grained Cu in the second wiring level. This may allow for increasing the mechanical strength of Cu in the second wiring level.

For example, the barrier layer may comprise a diffusion barrier for solder chemistry. Solder chemistries may be made from lead (Pb) and/or Tin (Sn) elements. Sn tends to react or diffuse in copper and may consume the copper. Barrier layers may be configured to separate the first Cu-containing wiring level from the second Cu-containing wiring level, and by that avoid diffusion of Sn into first Cu-containing wiring level, thereby protecting it and the device from thermal run away. Ti—Cu as well TiW both layers may act as diffusion barrier against the Sn diffusion. For example, Al may be added as a solute in second Cu-containing wiring level.

For example, the barrier layer may include a stress compensation layer. For example, the barrier layer may include or be made of TiW.

For example, the first wiring level may have a thickness ranging from 2 μm to 7 μm. The second wiring level may have a thickness ranging from 10 μm to 20 μm. For example, a ratio of the thickness of the second wiring level to the thickness of the first wiring level may range from 2 to 20, for example. The thickness of the first wiring level and/or second wiring level may be set depending on requirements of, for example, transverse conductivity or, for example, gate lines or source/emitter or gate runners, mechanical robustness, heat dissipation.

For example, the intermediate dielectric structure may include first passivation structure comprising an imide, oxide or nitride, for example. The intermediate dielectric structure may laterally separate and electrically isolate parts of the first wiring level (e.g. gate line, gate or source/emitter runner, lower source or emitter pads) from one another.

For example, the vertical power semiconductor device may further include a second passivation structure arranged on a part of the first passivation structure. For example, the second passivation structure may include one or more of a dielectric material, such as, for example, an oxide or a nitride, an imide, or an epoxy material. The second passivation structure may be formed after patterning the second wiring level, such as, for example, after etching the second wiring level. The second passivation structure may laterally separate and electrically isolate parts of the second wiring level (e.g. the gate pad and the source or emitter pad) from one another. The second passivation structure may also be formed over a part of the gate pad and/or the source or emitter pad such as an edge area of the gate pad and/or the source or emitter pad, for example.

For example, the vertical power semiconductor device may further include an electroless plating structure on the gate pad and on the source or emitter pad. The electroless plating structure may laterally adjoin to the second passivation structure of the intermediate dielectric structure, for example. For example, the electroless plating structure may include at least one of a NiMoP layer, or a NiP/Au, or a NiP/Pd/Au, or a NiP/Ag, or a NiMoP/Ag layer stack.

For example, the first wiring level may further include a lower gate pad arranged between the gate pad of the second wiring level and the first surface. The lower gate pad may be electrically connected to the gate pad of the second wiring level. The intermediate dielectric structure may laterally adjoin to the lower gate pad, for example. The intermediate dielectric structure may also be formed over the lower gate pad in an edge area of the lower gate pad. Thus, a bottom side of the gate pad may be formed on a top side of the intermediate dielectric structure in the edge area of the lower gate pad as well as on a top side of the lower gate pad.

For example, the first lower source or emitter pad may laterally extend below the gate pad of the second wiring level. The first lower source or emitter pad may be electrically insulated from the gate pad of the second wiring level by the intermediate dielectric structure. The intermediate dielectric structure may not only laterally isolate the first lower source or emitter pad but may extend over the first lower source or emitter pad at least in an overlap area between the gate pad and the first source or emitter pad. Below the gate pad, an electric active area may be present. For example, transistor cells may be arranged in the SiC semiconductor device directly below the gate pad, for example.

Another example of the present disclosure relates to a vertical power semiconductor device. Details with respect to structure, or function, or technical benefit of features described above with respect to the exemplary vertical power semiconductor devices, such as, for example, details with respect to the SiC semiconductor body, or the wiring level, or the intermediate dielectric structure, likewise apply to the examples described below. The vertical power semiconductor device includes a SiC semiconductor body having a first surface and a second surface opposite to the first surface. The vertical power semiconductor device may further include a first trench structure extending into the SiC semiconductor body from the first surface. The vertical power semiconductor device may further include a plurality of second trench structures branching off from the first trench structure. A cross-sectional area of the first trench structure may be larger than a cross sectional area of each of the plurality of second trench structures. The vertical power semiconductor device may further include a wiring level over the first surface. The wiring level includes a gate pad and a source or emitter pad. For example, the vertical power semiconductor device may include a plurality of first trench structures. Second trench structures branching off from neighboring first trench structures may merge. In other words, the plurality of first trench structures and the plurality of second trench structures may define a grid, for example. The first trench structure may include a gate line. By burying the gate line below the first surface of the SiC semiconductor body, the source or emitter pad is not interrupted by the gate line and thus comparatively larger, thereby enabling a larger surface for interconnect technologies (e.g. sintering or soldering) that may facilitate easier sintering on the source or emitter pad. This may also allow for increasing maximum current densities compared with a wire-based interconnection scheme, for example.

For example, a minimum lateral extent of the first trench structure may be larger than a minimum lateral extent of each of the plurality of second trench structures. The minimum lateral extent may refer to a lateral direction that is perpendicular to a longitudinal direction of the respective trench structure.

For example, a vertical extent of the first trench structure may be larger than a vertical extent of each of the plurality of second trench structures.

For example, the first trench structure may include a gate line material and a gate line dielectric arranged between the gate line material and the SiC semiconductor body. Each of the plurality of second trench structures may include a gate electrode material and a gate dielectric arranged between the gate electrode material and the SiC semiconductor body. A thickness of the gate line dielectric at a bottom side of the first trench structure may be larger than a thickness of the gate dielectric at a bottom side of each of the second trench structures. For example, a ratio of the thickness of the gate line dielectric at a bottom side of the first trench structure, such as, for example, 10 nm to 200 nm, to the thickness of the gate dielectric at a bottom side of each of the second trench structures may range from 2 to 50. The first trench structure may laterally extend to a gate runner that at least party surrounds a transistor cell area of the vertical power semiconductor device. The gate line material of the first trench structure may be electrically connected to the gate runner at an interconnection area. For example, in a top view, the interconnection area may be an overlap area between the first trench structure and the gate runner.

For example, each of the gate electrode material and the gate line material may include doped polycrystalline silicon or a metal, such as, for example, tungsten (W).

Details with respect to structure, or function, or technical benefit of features described above with respect to a vertical power semiconductor device such as a FET, or JFET, or IGBT, or thyristor, likewise apply to the exemplary methods described herein. Processing the SiC semiconductor body may comprise one or more optional additional features corresponding to one or more aspects mentioned in connection with the proposed concept or one or more examples described above or below.

An example of the present disclosure relates to a method of manufacturing a vertical power semiconductor device. The method includes forming a first wiring level over a first surface of a SiC semiconductor body having the first surface and a second surface opposite to the first surface. The first wiring level may include a first lower source or emitter pad and a second lower source or emitter pad. The method further includes forming a second wiring level over the first wiring level. The second wiring level may include a gate pad and a source or emitter pad. The source or emitter pad of the second wiring level may be electrically connected to the first lower source or emitter pad and to the second lower source or emitter pad of the first wiring level. The first wiring level may further include a gate line laterally arranged between the first lower source or emitter pad and the second lower source or emitter pad. The gate line may be vertically arranged between the source or emitter pad of the second wiring level and the first surface. The gate line may be electrically insulated from the source or emitter pad of the second wiring level by an intermediate dielectric structure.

Another example of the present disclosure relates to another method of manufacturing a vertical power semiconductor device. The method includes forming a first trench structure extending into a SiC semiconductor body from a first surface. The SiC semiconductor body has the first surface and a second surface opposite to the first surface. The method further includes forming a plurality of second trench structures branching off from the first trench structure. A cross-sectional area of the first trench structure may be larger than a cross sectional area of each of the plurality of second trench structures. The method further includes forming a wiring level over the first surface. The wiring level may include a gate pad and a source or emitter pad.

The description and drawings merely illustrate the principles of the disclosure. Furthermore, all examples recited herein are principally intended expressly to be only for illustrative purposes to aid the reader in understanding the principles of the disclosure and the concepts contributed to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, such as, for example, by expressions like “thereafter”, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

The examples and features described above and below may be combined. Functional and structural details (e.g. materials, dimensions) described with respect to the examples above shall likewise apply to the examples illustrated in the figures and described further below.

More details and aspects are mentioned in connection with the examples described above or below. Processing a SiC semiconductor body, such as, for example, a wafer, may comprise one or more optional additional features corresponding to one or more aspects mentioned in connection with the proposed concept or one or more examples described above or below.

FIG. 1 schematically and exemplarily shows a partial cross-sectional view of an example of a vertical power semiconductor device 100.

The vertical power semiconductor device includes a SiC semiconductor body 102 having a first surface 1031 and a second surface 1032 opposite to the first surface 1031. In an element area 1021 of the semiconductor body 102 adjoining to the first surface 1031 device elements of an active area, such as, for example, transistor cells, and/or or an edge termination area, such as, for example, edge termination structures, may be formed. The specific structure of the device elements in the element area 1021 depend on the type of vertical power semiconductor device, such as, for example, JFET, or MOSFET, or IGBT, or thyristor, and also depend on the specific layout chosen for the transistor cells TCs or edge termination structures. The schematic illustrations of the present disclosure may include any of specific active area layouts or specific edge termination are layouts and are simplified in that the element area comprising the active area or the edge termination area in the SiC semiconductor body 102 is denoted by the dashed line 1021.

A first wiring level 104 is arranged over the first surface 1031. The first wiring level 104 includes a first lower source or emitter pad 1041 and a second lower source or emitter pad 1042. A second wiring level 106 is arranged on the first wiring level 104. The second wiring level 106 includes a gate pad 1061 and a source or emitter pad 1062. The source or emitter pad 1062 of the second wiring level 106 laterally extends over the first lower source or emitter pad 1041 and the second lower source or emitter pad 1042 and is electrically connected to the first lower source or emitter pad 1041 and to the second lower source or emitter pad 1042 via a top side of each of the first lower source or emitter pad 1041 and to the second lower source or emitter pad 1042.

The first wiring level 104 further includes a gate line 1043 between the first lower source or emitter pad 1041 and the second lower source or emitter pad 1042. The gate line 1043 is vertically arranged between the source or emitter pad 1062 of the second wiring level 106 and the first surface 1031. A thickness d1 of the first wiring level 104 is smaller than thickness d2 of the second wiring level 106. The gate line 1043 is electrically insulated from the source or emitter pad 1062 of the second wiring level 106 by an intermediate dielectric structure 108, such as, for example, a first passivation structure 1081 of the intermediate dielectric structure 108.

In the exemplary vertical power semiconductor device 100 illustrated in FIG. 1, the first wiring level 104 further includes a lower gate pad 1044 arranged between the gate pad 1061 of the second wiring level 106 and the first surface 1031. The lower gate pad 1044 is electrically connected to the gate pad 1061 of the second wiring level 106.

A second passivation structure 1082 laterally separates and electrically insulates parts of the second wiring level 106 from one another. As is illustrated in FIG. 1, the second passivation structure 1082 laterally separates and electrically insulates the gate pad 1061 and the source or emitter pad 1062 from one another.

Figure 2:
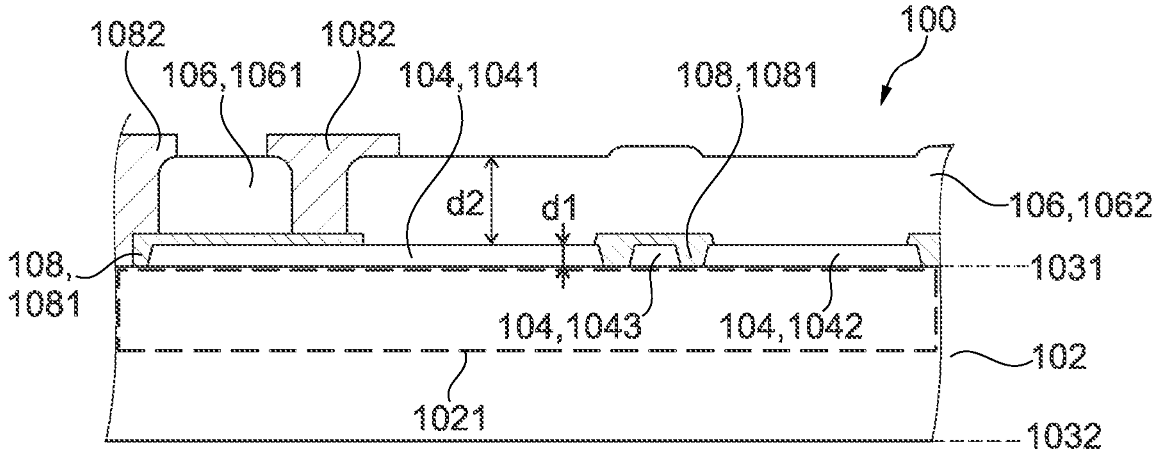

FIG. 2 schematically and exemplarily shows a partial cross-sectional view of another example of a vertical power semiconductor device 100.

The vertical power semiconductor device 100 of FIG. 2 differs from the exemplary device illustrated in FIG. 1 in that the first lower source or emitter pad 1041 extends below the gate pad 1061. The first passivation structure 1081 of the intermediate dielectric structure 108 laterally extends over the first source or emitter pad 1041 for providing an electric isolation between the first source or emitter pad 1061 and the gate pad 1061. In the semiconductor body 102 directly below the gate pad 1061, a part of an active area of the vertical power semiconductor device 100, such as, for example, transistor cells, may be arranged.

Figure 3:
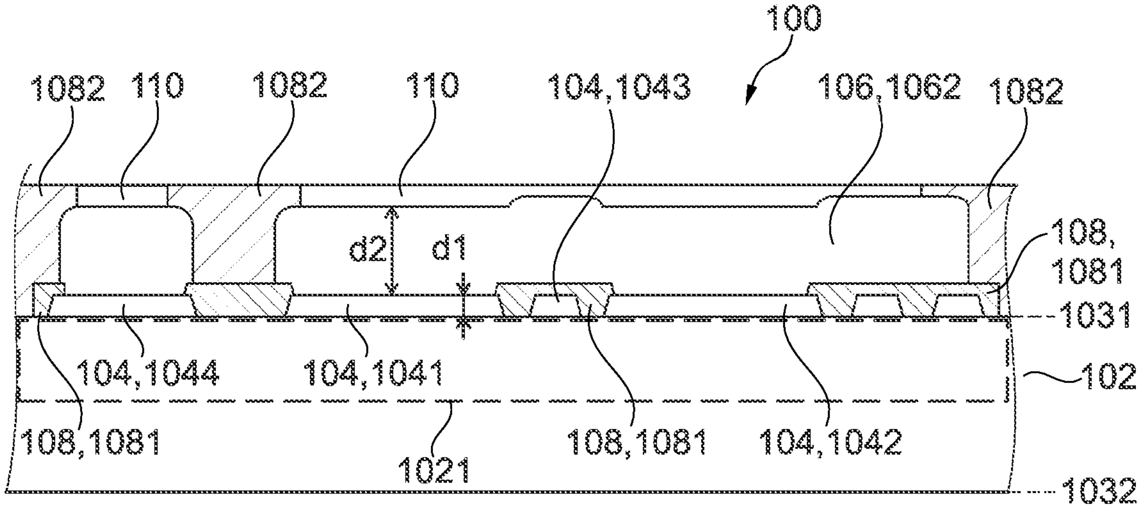

FIG. 3 schematically and exemplarily shows a partial cross-sectional view of another example of a vertical power semiconductor device 100.

The vertical power semiconductor device 100 of FIG. 3 differs from the exemplary device illustrated in FIG. 1 by further including an electroless plating structure 110 on the gate pad 1061 and on the source or emitter pad 1062.

Figure 4A:
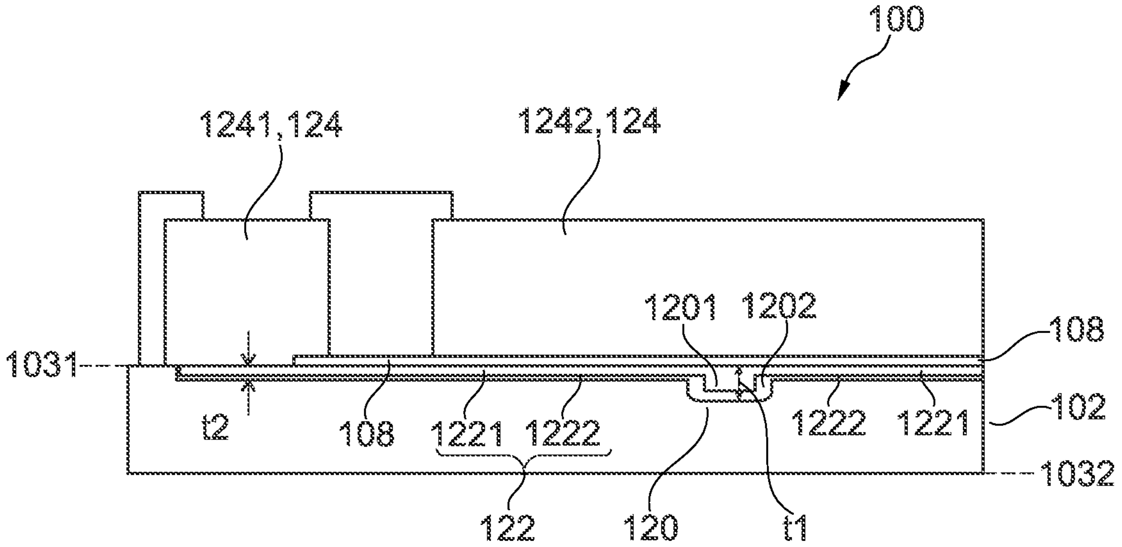
FIGS. 4A and 4B are schematic cross-sectional and top views for illustrating another example of a vertical power semiconductor device including a first trench structure and second trench structures branching off from the first trench structure.
Figure 4B:
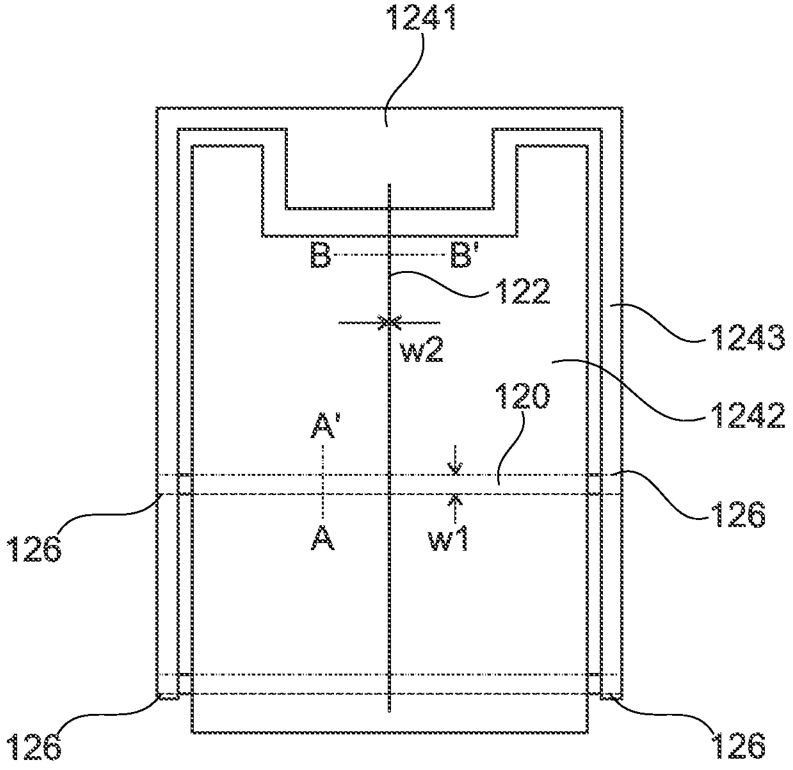

FIG. 4A schematically and exemplarily shows a partial cross-sectional view of an example of a vertical power semiconductor device 100. FIG. 4B is an exemplary top view of the vertical power semiconductor device 100 of FIG. 4A.

Referring to FIGS. 4A, 4B, the vertical power semiconductor device 100 includes a first trench structure 120 extending into the SiC semiconductor body 102 from the first surface 1031. A plurality of second trench structures 122 branch off from the first trench structure 120 (for illustration purposes, only one of a plurality of parallel second trench structures is shown). A cross-sectional area of the first trench structure 120 is larger than a cross sectional area of each of the plurality of second trench structures 122. A minimum lateral extent w1 of the first trench structure 120 is larger than a minimum lateral extent w2 of each of the plurality of second trench structures 122. A vertical extent t1 of the first trench structure 120 is larger than a vertical extent t2 of each of the plurality of second trench structures 122. In other examples, the vertical extents t1, t2 may also be equal.

The first trench structure 120 includes a gate line material 1201 and a gate line dielectric 1202 arranged between the gate line material 1201 and the SiC semiconductor body 102. Each of the plurality of second trench structures 122 includes a gate electrode material 1221 and a gate dielectric 1222 arranged between the gate electrode material 1221 and the SiC semiconductor body 102. A thickness of the gate line dielectric 1202 at a bottom side of the first trench structure 120 is larger than a thickness of the gate dielectric 1222 at a bottom side of each of the second trench structures 122. The first trench structure 120 laterally extends to a gate runner 1243 that at least party surrounds a transistor cell area of the vertical power semiconductor device 100. The gate runner 1243 turns into a gate pad 1241 of a wiring level 124. The gate runner 1243 may be formed as part of the wiring level 124. As an alternative or in addition, the gate runner 1243 may be formed as a continuation of the first trench structure 120, i.e. by a conductive material filled in a trench that is electrically insulated from the SiC semiconductor body 102 by a dielectric. The gate line material 1201 of the first trench structure 120 may be electrically connected to the gate runner 1243 at an interconnection area 126. For example, in a top view, the interconnection area 126 may be an overlap area between the first trench structure 120 and the gate runner 1243. The wiring level 124 further includes a source or emitter pad 1242.

The schematic cross-sectional views of FIGS. 5A to 5F illustrate an example of manufacturing the first trench structure 120 and the second trench structures 122 branching off from the first trench structure 120. For illustration purposes, the cross-sectional views the first trench structure 120 and the second trench structures 122 are shown side by side separated by a dashed line although these cross-sectional views are taken along different lateral directions, such as, for example, along line AA' of FIG. 4B for the first trench structure 120 and along line BB' for one of the second trench structures 122.

Figure 5A:
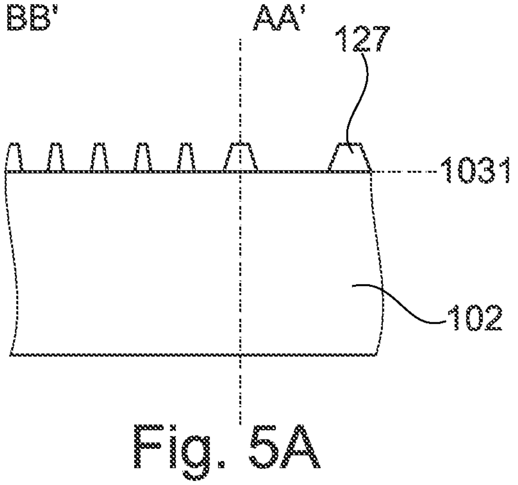
FIGS. 5A to 5F are schematic cross-sectional views for illustrating an example of manufacturing the first trench structure and the second trench structures branching off from the first trench structure.

Referring to FIG. 5A, a patterned mask layer 127, such as, for example, a hard mask or resist mask, is formed on the first surface 1031 of the SiC semiconductor body 102.

Figure 5B:
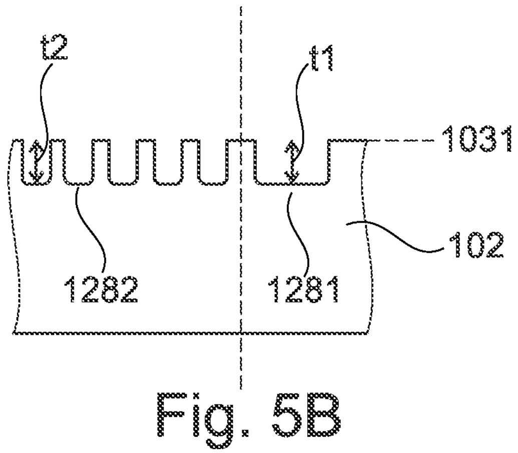

Referring to FIG. 5B, a gate line trench 1281 and gate trenches 1282 are formed by an etch process through openings in the patterned mask layer 127. The mask layer 127 is removed and an optional anneal process, such as, for example, a hydrogen anneal process, may be carried out.

Figure 5C:
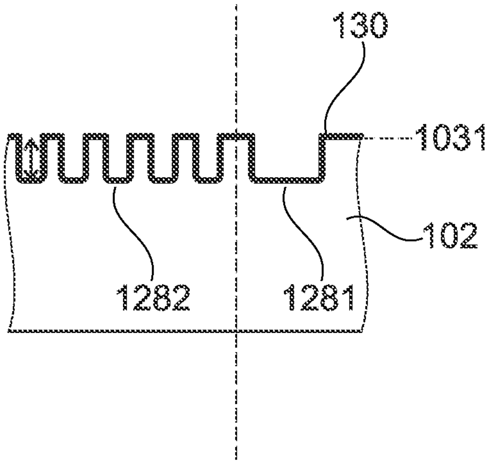

Referring to FIG. 5C, a dielectric layer structure 130 including one or more dielectric layer(s) such as an oxide, nitride or Tetraethyl orthosilicate (TEOS) is formed, such as, for example, by one or more deposition processes. The dielectric layer structure 130 lines sidewalls and a bottom side of the gate and gate line trenches 1282, 1281 as well as the first surface 1031 of the SiC semiconductor body 102.

Figure 5D:
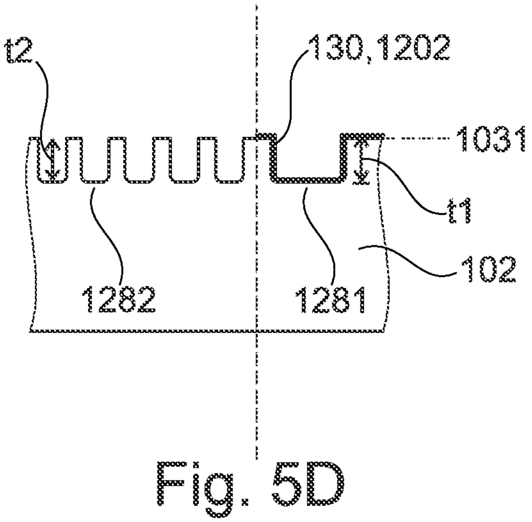

Referring to FIG. 5D, the dielectric layer structure 130 is removed in an area of the gate trenches 1282 and remains in the first trench 1281 as the gate line dielectric 1202.

Figure 5E:
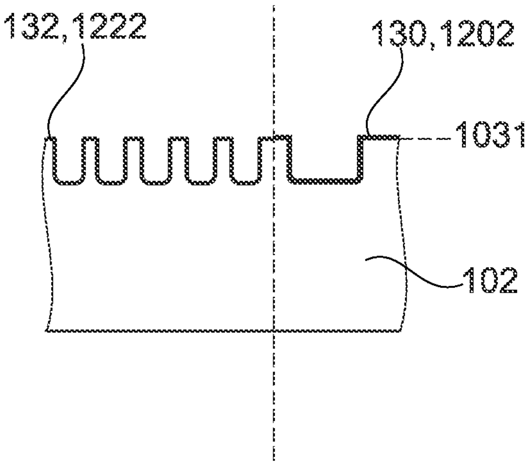

Referring to FIG. 5E, a dielectric layer structure 132 including one or more dielectric layer(s) such as a thermal oxide, or a nitride, or a high-k dielectric is formed in the gate trenches 1282 and remains as the gate dielectric 1222.

Figure 5F:
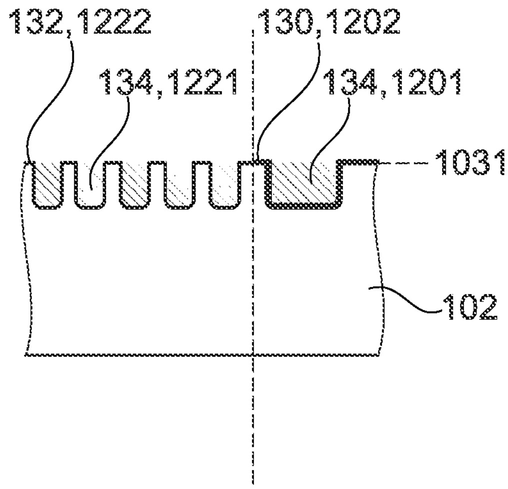

Referring to FIG. 5F, a conductive layer structure 134 including one or more conductive layer(s) is formed, such as, for example, by one or more deposition processes, in the gate line trench 1281 and in the gate trenches 1282. The deposition process(es) may be followed by a recess process of the conductive material up to the first surface 1031, for example. The conductive layer structure 134 filling the gate trenches 1282 remains as the gate electrode 1221, and the conductive layer structure 134 filling the gate trenches 1282 remains as the gate electrode 132, 1221. In the exemplary processes illustrated in FIGS. 5A to 5F, a vertical extent t1 of the gate line trench 1281 may be equal, or, caused by the manufacturing process, slightly larger than a vertical extent t2 of the gate trenches 1282. However, according to other examples, the vertical extent t2 may be set larger than t1 by separately processing the gate line trench 1281 and the gate trenches 1282, for example.

The description and drawings merely illustrate the principles of the disclosure. Furthermore, all examples recited herein are principally intended expressly to be only for illustrative purposes to aid the reader in understanding the principles of the disclosure and the concepts contributed to furthering the art. All statements herein reciting principles, aspects, and examples of the disclosure, as well as specific examples thereof, are intended to encompass equivalents thereof.

The aspects and features mentioned and described together with one or more of the previously detailed examples and figures, may as well be combined with one or more of the other examples in order to replace a like feature of the other example or in order to additionally introduce the feature to the other example.

The invention claimed is:

1. A vertical power semiconductor device, comprising:

a silicon carbide (SiC) semiconductor body having a first surface and a second surface opposite to the first surface;

a first wiring level over the first surface, the first wiring level comprising a first lower source or emitter pad and a second lower source or emitter pad; and a second wiring level over the first wiring level, the second wiring level comprising a gate pad and a source or emitter pad, wherein the source or emitter pad of the second wiring level is electrically connected to the first lower source or emitter pad and to the second lower source or emitter pad of the first wiring level, wherein the first wiring level further comprises a gate line laterally arranged between the first lower source or emitter pad and the second lower source or emitter pad, wherein the gate line is vertically arranged between the source or emitter pad of the second wiring level and the first surface, and the gate line is electrically insulated from the source or emitter pad of the second wiring level by an intermediate dielectric structure.

2. The vertical power semiconductor device of claim 1, wherein at least one of the first wiring level or the second wiring level comprises copper.

3. The vertical power semiconductor device of claim 1, further comprising a barrier layer arranged between the first wiring level and the second wiring level.

4. The vertical power semiconductor device of claim 3, wherein the barrier layer comprises a titanium-tungsten (Ti—W) alloy or a copper-titanium (Cu—Ti) alloy.

5. The vertical power semiconductor device of claim 3, wherein the barrier layer comprises a diffusion barrier for solder chemistry.

6. The vertical power semiconductor device of claim 3, wherein the barrier layer comprises a stress compensation layer.

7. The vertical power semiconductor device of claim 1, wherein at least one of the first wiring level has a first thickness ranging from 2 μm to 7 μm, or the second wiring level has a second thickness ranging from 10 μm to 20 μm.

8. The vertical power semiconductor device of claim 1, wherein the intermediate dielectric structure includes a first passivation structure comprising at least one of imide, oxide or nitride.

9. The vertical power semiconductor device of claim 8, further comprising a second passivation structure arranged on at least a part of the first passivation structure.

10. The vertical power semiconductor device of claim 1, further comprising an electroless plating structure on the gate pad and on the source or emitter pad.

11. The vertical power semiconductor device of claim 10, wherein the electroless plating structure comprises at least one of a NiMoP layer, a NiP/Au, a NiP/Pd/Au, a NiP/Ag, or a NiMoP/Ag layer stack.

12. The vertical power semiconductor device of claim 1, wherein the first wiring level further comprises a lower gate pad arranged between the gate pad of the second wiring level and the first surface, wherein the lower gate pad is electrically connected to the gate pad of the second wiring level.

13. The vertical power semiconductor device of claim 1, wherein the first lower source or emitter pad laterally extends below the gate pad of the second wiring level, the first lower source or emitter pad being electrically insulated from the gate pad of the second wiring level by the intermediate dielectric structure.

14. A vertical power semiconductor device, comprising:

a silicon carbide (SiC) semiconductor body having a first surface and a second surface opposite to the first surface;

a first trench structure extending into the SiC semiconductor body from the first surface;

a plurality of second trench structures branching off from the first trench structure, wherein a cross-sectional area of the first trench structure is larger than a cross sectional area of each of the plurality of second trench structures; and a wiring level over the first surface, the wiring level comprising a gate pad and a source or emitter pad.

15. The vertical power semiconductor device of claim 14, wherein a minimum lateral extent of the first trench structure is larger than a minimum lateral extent of each of the plurality of second trench structures.

16. The vertical power semiconductor device of claim 14, wherein a first vertical extent of the first trench structure is larger than a second vertical extent of each of the plurality of second trench structures.

17. The vertical power semiconductor device of claim 14, wherein the first trench structure includes a gate line material and a gate line dielectric arranged between the gate line material and the SiC semiconductor body, and each of the plurality of second trench structures includes a gate electrode material and a gate dielectric arranged between the gate electrode material and the SiC semiconductor body; and wherein a first thickness of the gate line dielectric at a bottom side of the first trench structure is larger than a thickness of the gate dielectric at a bottom side of each of the second trench structures.

18. The vertical power semiconductor device of claim 17, wherein at least one of the gate electrode material or the gate line material comprises at least one doped polycrystalline silicon or a metal.

19. A method of manufacturing a vertical power semiconductor device, the method comprising:

forming a first wiring level over a first surface of a silicon carbide (SiC) semiconductor body having the first surface and a second surface opposite to the first surface, the first wiring level comprising a first lower source or emitter pad and a second lower source or emitter pad; and forming a second wiring level over the first wiring level, the second wiring level comprising a gate pad and a source or emitter pad, wherein the source or emitter pad of the second wiring level is electrically connected to the first lower source or emitter pad and to the second lower source or emitter pad of the first wiring level, wherein the first wiring level further comprises a gate line laterally arranged between the first lower source or emitter pad and the second lower source or emitter pad, wherein the gate line is vertically arranged between the source or emitter pad of the second wiring level and the first surface, and the gate line is electrically insulated from the source or emitter pad of the second wiring level by an intermediate dielectric structure.

* * * * *